United States Patent
Lastusaari et al.

(10) Patent No.: US 10,533,131 B2
(45) Date of Patent: Jan. 14, 2020

(54) SYNTHETIC MATERIAL FOR DETECTING ULTRAVIOLET RADIATION AND/OR X-RADIATION

(71) Applicant: TURUN YLIOPISTO, Turun yliopisto (FI)

(72) Inventors: Mika Lastusaari, Turku (FI); Isabella Norrbo, Turku (FI)

(73) Assignee: TURUN YLIOPISTO, Turun Yliopisto (FI)

( * ) Notice: Subject to any disclaimer, the term of this patent is extended or adjusted under 35 U.S.C. 154(b) by 0 days.

(21) Appl. No.: 16/099,807

(22) PCT Filed: May 8, 2017

(86) PCT No.: PCT/FI2017/050355
§ 371 (c)(1),
(2) Date: Nov. 8, 2018

(87) PCT Pub. No.: WO2017/194834
PCT Pub. Date: Nov. 16, 2017

(65) Prior Publication Data
US 2019/0106620 A1  Apr. 11, 2019

(30) Foreign Application Priority Data
May 9, 2016 (FI) .................................... 20165392

(51) Int. Cl.
*C09K 9/00* (2006.01)
*C09K 11/00* (2006.01)
*G01T 1/16* (2006.01)
*G01T 1/06* (2006.01)
*C09K 11/67* (2006.01)

(52) U.S. Cl.
CPC .............. *C09K 11/676* (2013.01); *C09K 9/00* (2013.01); *G01T 1/06* (2013.01); *G01T 1/1606* (2013.01)

(58) Field of Classification Search
CPC ............ C09K 9/00; G01T 1/06; G01T 1/1606
See application file for complete search history.

(56) References Cited

U.S. PATENT DOCUMENTS

| 2,752,521 A | 6/1956 | Ivey |
| 2,761,846 A | 9/1956 | Medved |
| 3,923,529 A | 12/1975 | Araujo |

(Continued)

FOREIGN PATENT DOCUMENTS

| EP | 1681335 A2 | 7/2006 |
| WO | 2010070290 | 6/2010 |

OTHER PUBLICATIONS

Webb et al. "Know Your Standard: Clarifying the CIE Erythema Action Spectrum", Photochemistry and Photobiology, 2011; pp. 483-486. (Year: 2011).*

(Continued)

*Primary Examiner* — Mark R Gaworecki
(74) *Attorney, Agent, or Firm* — Brooks Kushman P.C.

(57) ABSTRACT

The invention relates to a material represented by the following formula (I)

$$(M')_8M''_6M'''_6O_{24}(X,S)_2:M''''$$  formula (I).

Further, the invention relates to an ultraviolet radiation sensing material, to an X-radiation sensing material, to different uses, to a device and to a method for determining the intensity of ultraviolet radiation.

19 Claims, 3 Drawing Sheets

(56) References Cited

U.S. PATENT DOCUMENTS 4,490,286 A 12/1984 Volynets et al.
5,581,090 A 12/1996 Goudjil

OTHER PUBLICATIONS

Gaft et al., Laser-induced Time-resolved Luminescence of Tugtupite, Sodalite, and Hackmanite; Phys Chem Minerals (2009) 36: pp. 127-141.
Norrbo et al., Persistent Luminescence of Tenebrescent . . . ; Inorganic Chemistry (2015); pp. 7717-7724.
Norrbo et al., Persistent Luminescence of Tenebrescent . . . ; Supporting Information; pp. S1-S6.
Norrbo et al., Mechanisms of Tenebrescence and Persistent Luminescence in Synthetic Hackmanite . . . ; Inorganic Chemistry (2015); pp. 11592-11602.
Armstrong et al., Structural Observation of Photochromism; Royal Society of Chemistry—Chemistry Communication, 2006; pp. 1094-1096.

\* cited by examiner

SYNTHETIC MATERIAL FOR DETECTING ULTRAVIOLET RADIATION AND/OR X-RADIATION

CROSS-REFERENCE TO RELATED APPLICATION

This application is the U.S. national phase of PCT Application No. PCT/FI2017/050355 filed on May 8, 2017, which claims priority to FI Patent Application No. 20165392 filed on May 9, 2016, the disclosures of which are incorporated in their entirety by reference herein.

FIELD OF THE INVENTION

The invention relates to a material, to an ultraviolet radiation sensing material, to an X-radiation sensing material, to a device, to uses of the material, and to a method for determining the intensity of ultraviolet radiation and/or X-radiation.

BACKGROUND OF THE INVENTION

Elevated levels of ultraviolet (UV) irradiation, whether caused by sunlight or tanning ultraviolet devices, has the adverse effect of increasing the probability of skin cancer, other diseases of the skin as well as skin aging. Knowing when to seek for cover from ultraviolet radiation or when to apply or reapply sunscreen lotion is thus of importance.

UV responsive photochromic organic molecules that change color upon UV exposure can be used. Currently, there are such devices as UV indicator bracelets and cards that can be used to indicate the level of solar UV radiation. These are based on organic molecules such as spiro-oxazines, spiropyrans, fulgides, fulgimides, bisimidazoles and viologen derivatives. Usually, the color from these materials fades when UV exposure is removed, thus making them reusable indicators, but some of them are for single use. However, many of the reusable photochromic molecules have a short lifetime, and they can thus lose their functionality after too long or too intense UV exposure. Spiro-oxazines, however, may last for two to three years. The drawback for the spiro-oxazines is their high price. The high prices and short lifetimes decrease the usability of these materials in the photochromic UV indicator devices.

The inventors have therefore recognized a need for a low-cost ultraviolet radiation sensing material that is stable for a long period of time.

PURPOSE OF THE INVENTION

The purpose of the invention is to provide a new type of material and its use. Further, the purpose of the invention is to provide an ultraviolet radiation sensing material and its use. Further, the purpose of the invention is to provide an X-radiation sensing material and its use. Further, the purpose of the invention is to provide a device. Further, the purpose of the invention is to provide a method for determining the intensity of ultraviolet radiation and/or X-radiation.

SUMMARY

The material according to the present invention is characterized by what is presented in claim 1.

The ultraviolet radiation sensing material according to the present invention is characterized by what is presented in claim 15.

The X-radiation sensing material according to the present invention is characterized by what is presented in claim 16.

The device according to the present invention is characterized by what is presented in claim 17.

The use of the material according to the present invention is characterized by what is presented in claim 19, in claim 21, or in claim 22.

The method according to the present invention is characterized by what is presented in claim 23.

BRIEF DESCRIPTION OF THE DRAWINGS

The accompanying drawings, which are included to provide a further understanding of the invention and constitute a part of this specification, illustrate embodiments of the invention and together with the description help to explain the principles of the invention. In the drawings.

DETAILED DESCRIPTION OF THE INVENTION

Figure 1:
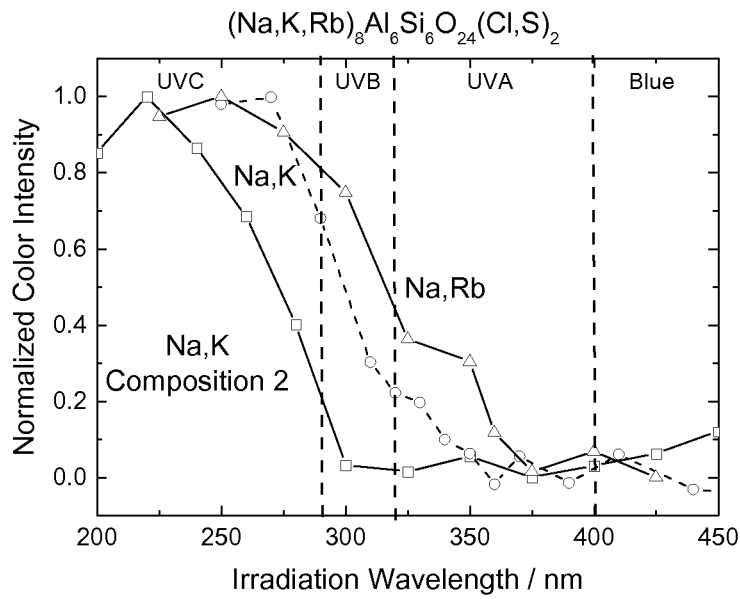
FIG. 1 discloses the test results of example 5.

The present invention relates to a material represented by the following formula (I)

$$(M')_8 M''_6 M'''_6 O_{24}(X,S)_2 : M''''$$  formula (I)

wherein

M' represents a combination of at least two monoatomic cations of different alkali metals selected from Group 1 of the IUPAC periodic table of the elements;

M'' represents a trivalent monoatomic cation of an element selected from Group 13 of the IUPAC periodic table of the elements, or of a transition element selected from any of Groups 3-12 of the IUPAC periodic table of the elements, or any combination of such cations;

M''' represents a monoatomic cation of an element selected from Group 14 of the IUPAC periodic table of the elements, or any combination of such cations;

X represents an anion of an element selected from Group 16 of the IUPAC periodic table of the elements, or any combination of such anions; and M'''' represents a dopant cation of an element selected from rare earth metals of the IUPAC periodic table of the elements, or from transition metals of the IUPAC periodic table of the elements, or any combination of such cations, or wherein M'''' is absent.

The present invention further relates to a material represented by the following formula (I)

$$(M')_8 M''_6 M'''_6 O_{24}(X,S)_2 : M''''$$  formula (I)

wherein

M' represents a monoatomic cation of an alkali metal selected from Group 1 of the IUPAC periodic table of the elements, or any combination of such cations;

M'' represents a trivalent monoatomic cation of an element selected from Group 13 of the IUPAC periodic table of the elements, or of a transition element selected from any of Groups 3-12 of the IUPAC periodic table of the elements, or any combination of such cations;

M''' represents a monoatomic cation of an element selected from Group 14 of the IUPAC periodic table of the elements, or any combination of such cations;

X represents an anion of an element selected from Group 16 of the IUPAC periodic table of the elements, or any combination of such anions; and M'''' represents a dopant cation of an element selected from rare earth metals of the IUPAC periodic table of the elements, or from transition metals of the IUPAC periodic table of the elements, or any combination of such cations, or wherein M'''' is absent.

The present invention further relates to a material represented by the following formula (I)

(M')$_8$M''$_6$M'''$_6$O$_{24}$(X,S)$_2$:M''''     formula (I)

wherein

M' represents a combination of at least two monoatomic cations of different alkali metals selected from Group 1 of the IUPAC periodic table of the elements;

M'' represents a trivalent monoatomic cation of an element selected from Group 13 of the IUPAC periodic table of the elements, or of a transition element selected from any of Groups 3-12 of the IUPAC periodic table of the elements, or any combination of such cations;

M''' represents a monoatomic cation of an element selected from Group 14 of the IUPAC periodic table of the elements, or any combination of such cations;

X represents an anion of an element selected from Group 16 of the IUPAC periodic table of the elements, or any combination of such anions, or X represents an anion of an element selected from a group consisting of F, Cl, Br, and I, or any combination of such anions; and M'''' represents a dopant cation of an element selected from rare earth metals of the IUPAC periodic table of the elements, or from transition metals of the IUPAC periodic table of the elements, or any combination of such cations, or wherein M'''' is absent.

The present invention further relates to a material represented by the following formula (I)

(M')$_8$M''$_6$M'''$_6$O$_{24}$(X,S)$_2$:M''''     formula (I)

wherein

M' represents a monoatomic cation of an alkali metal selected from Group 1 of the IUPAC periodic table of the elements, or any combination of such cations;

M'' represents a trivalent monoatomic cation of an element selected from Group 13 of the IUPAC periodic table of the elements, or of a transition element selected from any of Groups 3-12 of the IUPAC periodic table of the elements, or any combination of such cations;

M''' represents a monoatomic cation of an element selected from Group 14 of the IUPAC periodic table of the elements, or any combination of such cations;

X represents an anion of an element selected from Group 16 of the IUPAC periodic table of the elements, or any combination of such anions, or X represents an anion of an element selected from a group consisting of F, Cl, Br, and I, or any combination of such anions; and M'''' represents a dopant cation of an element selected from rare earth metals of the IUPAC periodic table of the elements, or from transition metals of the IUPAC periodic table of the elements, or any combination of such cations, or wherein M'''' is absent.

In one embodiment, M' represents a monoatomic cation of an alkali metal selected from a group consisting of Na, Li, K, and Rb, or any combination of such cations. In one embodiment, M' represents a monoatomic cation of an alkali metal selected from a group consisting of Li, K, and Rb, or any combination of such cations.

In one embodiment, M' represents a monoatomic cation of an alkali metal selected from Group 1 of the IUPAC periodic table of the elements, or any combination of such cations; with the proviso that M' does not represent the monoatomic cation of Na alone.

The material is a synthetic material. I.e. the material is synthetically prepared. The present invention relates to a synthetic material represented by the following formula (I)

(M')$_8$M''$_6$M'''$_6$O$_{24}$(X,S)$_2$:M''''     formula (I)

wherein

M' represents a combination of at least two monoatomic cations of different alkali metals selected from Group 1 of the IUPAC periodic table of the elements;

M'' represents a trivalent monoatomic cation of an element selected from Group 13 of the IUPAC periodic table of the elements, or of a transition element selected from any of Groups 3-12 of the IUPAC periodic table of the elements, or any combination of such cations;

M''' represents a monoatomic cation of an element selected from Group 14 of the IUPAC periodic table of the elements, or any combination of such cations;

X represents an anion of an element selected from Group 16 of the IUPAC periodic table of the elements, or any combination of such anions; and M'''' represents a cation of an element selected from rare earth metals of the IUPAC periodic table of the elements, or from transition metals of the IUPAC periodic table of the elements, or any combination of such cations, or wherein M'''' is absent.

The present invention relates to a synthetic material represented by the following formula (I)

(M')$_8$M''$_6$M'''$_6$O$_{24}$(X,S)$_2$:M''''     formula (I)

wherein

M' represents a combination of at least two monoatomic cations of different alkali metals selected from Group 1 of the IUPAC periodic table of the elements;

M'' represents a trivalent monoatomic cation of an element selected from Group 13 of the IUPAC periodic table of the elements, or of a transition element selected from any of Groups 3-12 of the IUPAC periodic table of the elements, or any combination of such cations;

M''' represents a monoatomic cation of an element selected from Group 14 of the IUPAC periodic table of the elements, or any combination of such cations;

X represents an anion of an element selected from Group 16 of the IUPAC periodic table of the elements, or any combination of such anions, or X represents an anion of an element selected from a group consisting of F, Cl, Br, and I, or any combination of such anions; and M'''' represents a cation of an element selected from rare earth metals of the IUPAC periodic table of the elements, or from transition metals of the IUPAC periodic table of the elements, or any combination of such cations, or wherein M'''' is absent.

In this specification, unless otherwise stated, the expression "monoatomic ion" should be understood as an ion consisting of a single atom. If an ion contains more than one atom, even if these atoms are of the same element, it is to be understood as a polyatomic ion. Thus, in this specification, unless otherwise stated, the expression "monoatomic cation" should be understood as a cation consisting of a single atom.

Hackmanite, which is a variety of sodalite material, is natural mineral having the chemical formula of $Na_8Al_6Si_6O_{24}(Cl,S)_2$. The inventors surprisingly found out that a synthetic hackmanite based material enabling the detection of ultraviolet radiation can be prepared. The inventors surprisingly found out that the synthetic material, as a result of being subjected to ultraviolet radiation, has the technical effect of showing color intensity, which is proportional with the irradiance of the sensed or detected radiation. The inventors also found out that a material can be prepared that has the added utility of not changing color in the absence of ultraviolet radiation and may thus be used to indicate whether ultraviolet radiation is present. The material may thus be used to detect and indicate the amount of e.g. ultraviolet B radiation and ultraviolet C radiation that cause sunburn.

Ultraviolet light is electromagnetic radiation with a wavelength from 10 nm (30 PHz) to 400 nm (750 THz). The electromagnetic spectrum of ultraviolet radiation (UVR) can be subdivided into a number of ranges recommended by the ISO standard ISO-21348, including ultraviolet A (UVA), ultraviolet B (UVB), ultraviolet C (UVC). The wavelength of UVA is generally considered to be 315-400 nm, the wavelength of UVB is generally considered to be 280-320 and the wavelength of UVC is generally considered to be 100-290 nm.

In one embodiment, the ultraviolet radiation comprises ultraviolet A radiation, ultraviolet B radiation and/or ultraviolet C radiation. In one embodiment, the ultraviolet radiation consists of ultraviolet A radiation, ultraviolet B radiation and/or ultraviolet C radiation. In one embodiment, the ultraviolet radiation is ultraviolet A radiation, ultraviolet B radiation and/or ultraviolet C radiation.

In one embodiment, M' represents a combination of at least two monoatomic cations of different alkali metals selected from Group 1 of the IUPAC periodic table of the elements, and wherein the combination comprises at most 66 mole percent (mol-%) of the monoatomic cation of Na. In one embodiment, M' represents a combination of at least two monoatomic cations of different alkali metals selected from Group 1 of the IUPAC periodic table of the elements, and wherein the combination comprises at most 50 mol-% of the monoatomic cation of Na. In one embodiment, M' represents a combination of at least two monoatomic cations of different alkali metals selected from Group of the IUPAC periodic table of the elements, and wherein the combination comprises at most 40 mol-% of the monoatomic cation of Na, or at most 30 mol-% of the monoatomic cation of Na, or at most 20 mol-% of the monoatomic cation of Na.

In one embodiment, M' represents a combination of at least two monoatomic cations of different alkali metals selected from Group 1 of the IUPAC periodic table of the elements, wherein the combination comprises 0-98 mol-% of the monoatomic cation of Na. In one embodiment, M' represents a combination of at least two monoatomic cations of different alkali metals selected from Group 1 of the IUPAC periodic table of the elements, wherein the combination comprises 0-98 mol-%, or 0-95 mol-%, or 0-90 mol-%, or 0-85 mol-%, or 0-80 mol-%, or 0-70 mol-%, of the monoatomic cation of Na. In one embodiment, M' represents a combination of at least two monoatomic cations of different alkali metals selected from Group 1 of the IUPAC periodic table of the elements, wherein the combination comprises 0-100 mol-% of the monoatomic cation of K. In one embodiment, M' represents a combination of at least two monoatomic cations of different alkali metals selected from Group 1 of the IUPAC periodic table of the elements, wherein the combination comprises 0-100 mol-% of the monoatomic cation of Rb. In one embodiment, M' represents a combination of at least two monoatomic cations of different alkali metals selected from Group 1 of the IUPAC periodic table of the elements, wherein the combination comprises 0-100 mol-% of the monoatomic cation of Li.

In one embodiment, M' represents a combination of at least two monoatomic cations of different alkali metals selected from a group consisting of Li, Na, K, and Rb. In one embodiment, M' represents a combination of two monoatomic cations of different alkali metals selected from a group consisting of Li, Na, K, and Rb. In one embodiment, M' represents a combination of three monoatomic cations of different alkali metals selected from a group consisting of Li, Na, K, and Rb. In one embodiment, M' represents a combination of monoatomic cations of Li, Na, K, and Rb.

In one embodiment, M' represents a combination of a monoatomic cation of Na with a monoatomic cation of Li, a monoatomic cation of K and/or a monoatomic cation of Rb. In one embodiment, M' represents a combination of a monoatomic cation of Na with a monoatomic cation of K or a monoatomic cation of Rb. In one embodiment, M' represents a combination of a monoatomic cation of Na with a monoatomic cation of K and a monoatomic cation of Rb.

In one embodiment, M' represents a combination of a monoatomic cation of Na and a monoatomic cation of K; or a combination of a monoatomic cation of Na and a monoatomic cation of Rb; or a combination of a monoatomic cation of K and a monoatomic cation of Rb; or a combination of a monoatomic cation of Na, a monoatomic cation of K, and a monoatomic cation of Rb; or a combination of a monoatomic cation of K and a monoatomic cation of Rb.

In one embodiment, M' represents a combination of a monoatomic cation of Li and a monoatomic cation of Na; or a combination of a monoatomic cation of Li and a monoatomic cation of K; or a combination of a monoatomic cation of Li and a monoatomic cation of Rb; or a combination of a monoatomic cation of Li, a monoatomic cation of K, and a monoatomic cation of Rb; or a combination of a monoatomic cation of Li, a monoatomic cation of Na, a monoatomic cation of K and a monoatomic cation of Rb.

In one embodiment, M' represents a monoatomic cation of Li. In one embodiment, M' represents a monoatomic cation of K. In one embodiment, M' represents a monoatomic cation of Rb.

The combination of at least two monoatomic cations of different alkali metals selected from Group 1 of the IUPAC periodic table of the elements has the effect of enabling the preparation of a material that is sensitive to ultraviolet A radiation, ultraviolet B radiation and/or ultraviolet C radiation. The combination has the effect of enabling the preparation of a material being able to indicate the presence of at least one of ultraviolet A radiation, ultraviolet B radiation and ultraviolet C radiation, or the presence of all of ultraviolet A radiation, ultraviolet B radiation and ultraviolet C radiation.

In one embodiment, M" represents a trivalent monoatomic cation of a metal selected from a group consisting of Al and Ga, or a combination of such cations.

In one embodiment, M" represents a trivalent monoatomic cation of B.

In one embodiment, M'" represents a monoatomic cation of an element selected from a group consisting of Si and Ge, or a combination of such cations.

In one embodiment, X represents an anion of an element selected from a group consisting of F, Cl, Br, and I, or any combination of such anions.

In one embodiment, X represents an anion of an element selected from a group consisting of O, S, Se, and Te, or any combination of such anions.

In one embodiment, the material is represented by formula (I), wherein M'''' is absent. In this embodiment the material is not doped.

In one embodiment, the material is doped with at least one rare earth metal ion and/or at least one transition metal ion. In one embodiment, the material is doped with at least one rare earth metal ion and at least one transition metal ion. In one embodiment, the material is doped with at least one rare earth metal ion or at least one transition metal ion.

In one embodiment, the material is represented by formula (I), wherein M'''' represents a cation of an element selected from rare earth metals of the IUPAC periodic table of the elements, or from transition metals of the IUPAC periodic table of the elements, or any combination of such cations.

In one embodiment, M'''' represents a cation of an element selected from a group consisting of Eu and Tb, or a combination of such cations. In one embodiment, M'''' represents a cation of an element selected from a group consisting of Ti, V, Cr, Mn, Fe, Co, Ni, Cu, and Zn, or any combination of such cations.

In one embodiment, M' represents a combination of at least two monoatomic cations of different alkali metals selected from a group consisting of Li, Na, K, and Rb, and wherein the combination is selected in order to provide a predetermined absorption edge for the material. In this specification, unless otherwise stated, the expression "absorption edge" should be understood as the energy threshold over which energy the material will change color.

In one embodiment, the material is configured to change color on exposure to ultraviolet radiation, wherein the correlation between the intensity of the color of the material and the intensity of the ultraviolet radiation is calculated based on the following formula 1:

$$y = A1 * e^{(x/t1)} + y0 \quad \text{formula 1}$$

wherein the parameters have the following meanings:
y=color intensity [percent of black]
A1=amplitude for color
x=UV index value for sunlight or UV lamp power [%] for UVA, UVB, and/or UVC
t1=growth constant for color
y0=initial offset for color.

Based on the above formula 1, the radiation intensity can be calculated from the color intensity as follows:

$$x = t1 * [\ln(y-y0) - \ln A1].$$

In one embodiment, for solar UVI detection, A1=−1 to −15, t1=−30 to −5, and y0=5 to 20.

In one embodiment, for UVA detection, A1=−1.5 to −0.1, t1=−30 to −10, and y0=9.5 to 10.5.

In one embodiment, for UVB detection, A1=−3.0 to −1.8, t1=−450 to −20, and y0=11 to 13.

In one embodiment, for UVC detection, A1=−3.0 to −1.8, t1=−200 to −15, and y0=12 to 13.

The change in the combination of at least two monoatomic cations of different alkali metals selected from Group 1 of the IUPAC periodic table of the elements enables to prepare a material that can be adjusted to detect ultraviolet A radiation, ultraviolet B radiation and/or ultraviolet C radiation.

In one embodiment, the material is selected from a group consisting of $(Na,K)_8Al_6Si_6O_{24}(Cl,S)_2$, $(Na,Rb)_8Al_6Si_6O_{24}(Cl,S)_2$, $(Na,K,Rb)_8Al_6Si_6O_{24}(Cl,S)_2$, $(Na,K)_8Al_6Si_6O_{24}(Cl,S)_2$:Eu, $(Na,K)_8Al_6Si_6O_{24}(Cl,S)_2$:Tb, $(Li,K)_8Al_6Si_6O_{24}(Cl,S)_2$, $(Li,Rb)_8Al_6Si_6O_{24}(Cl,S)_2$, $(Li,K,Rb)_8Al_6Si_6O_{24}(Cl,S)_2$, and $(Li,Na,K,Rb)_8Al_6Si_6O_{24}(Cl,S)_2$.

In one embodiment, the material is $(Na,K)_8Al_6Si_6O_{24}(F_{0.7}S_{0.1})_2$. Said material may be used for sensing X-radiation.

In one embodiment, the material is $(Na,K)_8Al_6Si_6O_{24}(Cl_{0.8}S_{0.05})_2$. Said material may be used for sensing ultraviolet radiation.

In one embodiment, the material is synthesized by a reaction according to Norrbo et al. (Norrbo, I.; Głuchowski, P.; Paturi, P.; Sinkkonen, J.; Lastusaari, M., Persistent Luminescence of Tenebrescent $Na_8Al_6Si_6O_{24}$ (Cl,S)$_2$: Multifunctional Optical Markers. Inorg. Chem. 2015, 54, 7717-7724), which reference is based on Armstrong & Weller (Armstrong, J. A.; Weller, J. A. Structural Observation of Photochromism. Chem. Commun. 2006, 1094-1096) using stoichiometric amounts of Zeolite A and $Na_2SO_4$ as well as LiCl, NaCl, KCl and/or RbCl as the starting materials. The possibly used at least one dopant is added as an oxide, such as $Eu_2O_3$ or $Tb_4O_7$. The material can be prepared as follows: Zeolite A is first dried at 500° C. for 1 h. The initial mixture is then heated at 850° C. in air for 48 h. The product is then freely cooled down to room temperature and ground. Finally, the product is re-heated at 850° C. for 2 h under a flowing 12% $H_2$+88% $N_2$ atmosphere. The as-prepared materials are washed with water to remove any excess LiCl/NaCl/KCl/RbCl impurities. The purity can be verified with an X-ray powder diffraction measurement.

The present invention further relates to an ultraviolet radiation sensing material, wherein the material is a material according to one or more embodiments described in this specification. The present invention further relates to an ultraviolet radiation sensing material, wherein the ultraviolet radiation sensing material comprises the material according to one or more embodiments described in this specification.

The present invention further relates to an X-radiation sensing material, wherein the material is a material according to one or more embodiments described in this specification.

The present invention further relates to an ultraviolet and X-radiation sensing material, wherein the material is a material according to one or more embodiments described in this specification.

The present invention further relates to a device, wherein the device comprises a material according to one or more embodiments described in this specification. In one embodiment, the device is an ultraviolet radiation sensor, an ultraviolet radiation detector, or an ultraviolet radiation indicator. In one embodiment, the device is an X-radiation sensor, an X-radiation detector, an X-radiation indicator, or an X-radiation dose indicator.

The ultraviolet radiation indicator can be applied e.g. in a label on a bottle of skin cream or sunscreen, wherein the change in color would alert the user to the application of the sun protection. The material may be used e.g. on the outside of a window to alert the residents before going out about the ultraviolet radiation intensity. The material can also be mixed as a powder in the raw materials used for the production of a plastic bottle, a sticker, a glass and a similar product that is to be provided with a UV indicator. This offers the products themselves a UV indicator. The products containing the material may also be conceived as jewelry. The material can be used as a display portion of a meter, which is calibrated according to the shade.

The present invention further relates to the use of the material according to the present invention for indicating the presence of ultraviolet radiation. In one embodiment, the ultraviolet radiation is ultraviolet A radiation, ultraviolet B radiation and/or ultraviolet C radiation.

The present invention further relates to the use of the material according to the present invention for indicating the presence of electromagnetic radiation with a wavelength of 0.01-400 nm, or of 10-400 nm, or of 0.01-10 nm.

The present invention further relates to the use of the material according to the present invention for indicating the presence of X-radiation. X-radiation is electromagnetic radiation with a wavelength from 0.01 nm to 10 nm.

The inventors further surprisingly found out that the synthetic material described in this application, as a result of being subjected to X-radiation, has the technical effect of showing color intensity, which is proportional with the dose of the sensed or detected radiation. The inventors also found out that a material can be prepared that has the added utility of not changing color in the absence of X-radiation and may thus be used to indicate whether X-radiation is present. The material may thus be used to detect and indicate the amount of X-radiation.

The present invention further relates to the use of the material according to the present invention for indicating the presence of ultraviolet radiation and/or X-radiation. The present invention further relates to the use of the material according to the present invention for indicating the presence of ultraviolet radiation and X-radiation.

The present invention further relates to the use of the material according to the present invention in a security device. In one embodiment, the security device is selected from a group consisting of a thread, a foil and a hologram. In one embodiment the security device is an ink. In one embodiment, the security device is used on a banknote, a passport or an identity card.

The present invention further relates to a method for determining the intensity of ultraviolet radiation and/or X-radiation, wherein the method comprises:
  a) providing a material according to one or more embodiments described in this specification;
  b) subjecting the material provided in step a) to ultraviolet radiation and/or X-radiation;
  c) determining a change in the color of the material caused by the ultraviolet radiation and/or the X-radiation; and
  d) comparing the color of the material with a reference indicating the correlation of the intensity of the ultraviolet radiation and/or X-radiation with the color of the material.

The present invention further relates to a method for determining the intensity of ultraviolet radiation, wherein the method comprises:
  a) providing a material according to one or more embodiments described in this specification;
  b) subjecting the material provided in step a) to ultraviolet radiation;
  c) determining a change in the color of the material as result of being subjected to ultraviolet radiation; and
  d) comparing the color of the material with a reference indicating the correlation of the intensity of the ultraviolet radiation with the color of the material.

The present invention further relates to a method for determining the intensity of X-radiation, wherein the method comprises:
  a) providing a material according to one or more embodiments described in this specification;
  b) subjecting the material provided in step a) to X-radiation;
  c) determining a change in the color of the material caused by the X-radiation; and
  d) comparing the color of the material with a reference indicating the correlation of the intensity of the X-radiation with the color of the material.

The present invention further relates to the use of the material according to the present invention In one embodiment, provided is a method for determining the intensity of X-radiation and the obtained dose of X-radiation.

In one embodiment, step c) comprises visually determining the change in the color of the material.

The reference may be e.g. a card or the like that indicates the correlation between the intensity of the ultraviolet radiation and the intensity of the color of the material. In one embodiment, the intensity of the color of the material is used to indicate the value of the UV index. In one embodiment, the correlation between the intensity of the color of the material and the intensity of the ultraviolet radiation is calculated based on the following formula 1:

$$y = A1 * e^{(x/t1)} + y0 \qquad \text{formula 1}$$

wherein the parameters have the following meanings:
y=color intensity [percent of black]
A1=amplitude for color
x=UV index value for sunlight or UV lamp power [%] for UVA, UVB, and/or UVC
t1=growth constant for color
y0=initial offset for color.

The embodiments of the invention described hereinbefore may be used in any combination with each other. Several of the embodiments may be combined together to form a further embodiment of the invention. A material, a device, a use, or a method, to which the invention is related, may comprise at least one of the embodiments of the invention described hereinbefore.

The material has the added utility of being a low-cost material offering stability even in high UV levels as well as decoloration with white light.

The material has the added utility that it may not change color in the absence of UV radiation.

The material has the added utility that its color can be returned to colorless (white), i.e. decolored, with visible light or heating thus enabling it to be reused.

The material has the added utility that it follows well the erythemal action spectrum making it possible to monitor especially UVB and UVC that cause sunburn.

The material has the added utility that with sunlight the color intensity can be used to indicate the value of the UV index.

The material has the added utility that it may indicate the presence of X-radiation.

EXAMPLES

Reference will now be made in detail to the embodiments of the present invention, examples of which are illustrated in the accompanying drawings.

The description below discloses some embodiments of the invention in such a detail that a person skilled in the art is able to utilize the invention based on the disclosure. Not all steps of the embodiments are discussed in detail, as many of the steps will be obvious for the person skilled in the art based on this specification.

Example 1—Preparing $(Na,K)_8Al_6Si_6O_{24}(Cl,S)_2$

The material represented by the formula $(Na,K)_8Al_6Si_6O_{24}(Cl,S)_2$ was prepared in the following manner:

0.7000 g of dried (500° C. for 1 h) Zeolite A, 0.0600 g of $Na_2SO_4$ and 0.3067 g of KCl powders were mixed together. The mixture was heated at 850° C. in air for 48 h. The product was freely cooled down to room temperature and ground. Finally, the product was re-heated at 850° C. for 2 h under a flowing 12% $H_2$+88% $N_2$ atmosphere.

Example 2—Preparing $(Na,Rb)_8Al_6Si_6O_{24}(Cl,S)_2$

The material represented by the formula $(Na,Rb)_8Al_6Si_6O_{24}(Cl,S)_2$ was prepared in the following manner: 0.7000 g of dried (500° C. for 1 h) Zeolite A, 0.0600 g of $Na_2SO_4$ and 0.4957 g of RbCl powders were mixed together. The mixture was heated at 850° C. in air for 48 h. The product was freely cooled down to room temperature and ground. Finally, the product was re-heated at 850° C. for 2 h under a flowing 12% $H_2$+88% $N_2$ atmosphere.

Example 3—Preparing $(Na,K)_8Al_6Si_6O_{24}(Cl,S)_2$ (denoted Hereafter as "Na,K Composition 2")

The material represented by the formula $(Na,K)_8Al_6Si_6O_{24}(Cl,S)_2$ was prepared in the following manner: 0.7000 g of dried (500° C. for 1 h) Zeolite A, 0.0600 g of $Na_2SO_4$ and 0.1800 g of NaCl and 0.0675 g KCl powders were mixed together. The mixture was heated at 850° C. in air for 48 h. The product was freely cooled down to room temperature and ground. Finally, the product was re-heated at 850° C. for 2 h under a flowing 12% $H_2$+88% $N_2$ atmosphere.

Example 4—Preparing $(Na,K)_8Al_6Si_6O_{24}(Cl,S)_2$:Eu

The material represented by the formula $(NaK)_8Al_6Si_6O_{24}(Cl,S)_2$:Eu was prepared in the following manner: 0.7000 g of dried (500° C. for 1 h) Zeolite A, 0.0600 g of $Na_2SO_4$ and 0.1800 g of NaCl and 0.0675 g of KCl powders were mixed together with 0.002 g of $Eu_2O_2$ powder. The mixture was heated at 850° C. in air for 48 h. The product was freely cooled down to room temperature and ground. Finally, the product was re-heated at 850° C. for 2 h under a flowing 12% $H_2$+88% $N_2$ atmosphere.

Example 5—Testing of a Sample of the Materials Prepared in Example 1, Example 2 and Example 3

A sample of each of the materials prepared in example 1, example 2 and example 3 were tested by irradiating them for 1 min with selected wavelengths between 200 and 450 nm using a Varian Cary Eclipse luminescence spectrometer. After each irradiation, the sample holder was photographed and the irradiated and non-irradiated parts were analyzed with the ImageJ program to obtain the intensity of color. The sample was then replaced and re-irradiated with the next wavelength. The color intensities thus obtained were normalized so that without coloring a value of zero is obtained and the strongest coloring gives a value of one. The results are presented in FIG. 1 indicating the absorption edges for coloring of the prepared materials.

Example 6—Testing of a Sample of the Materials Prepared in Example 1, Example 2 and Example 4

A sample of each of the materials prepared in example 1, example 2 and example 4 were tested by irradiating for 1 min with a solar simulator lamp (LOT/QD LS0500) using different irradiances between 300 and 1200 $W/m^2$. The irradiances were measured using a hand-held Seaward Solar Survey 100 device. After irradiation, the change in the reflection spectrum of the material was measured with an Avantes AvaSpec 2084×14 spectrometer connected to a 600 micrometer optical fiber. The reflectance measurements were carried out under illumination from a 60 W incandescent light bulb located 20 cm above the sample. The thus obtained reflectance spectra were integrated in the visible wavelength range (400-700 nm) using Origin 2015 software (OriginLab) to obtain the total change in reflectance. This reflectance value is divided with that obtained for carbon black to obtain a value describing the color intensity in comparison with a completely black material. The dependence between color intensity and UV index for e.g. $(Na,K)_8Al_6Si_6O_{24}(Cl,S)_2$ was obtained as follows:

$$\text{Color intensity [\% of black]} = -11.4 * \exp^{(UV\ index/-6.64)} + 13.9$$

Figure 2:
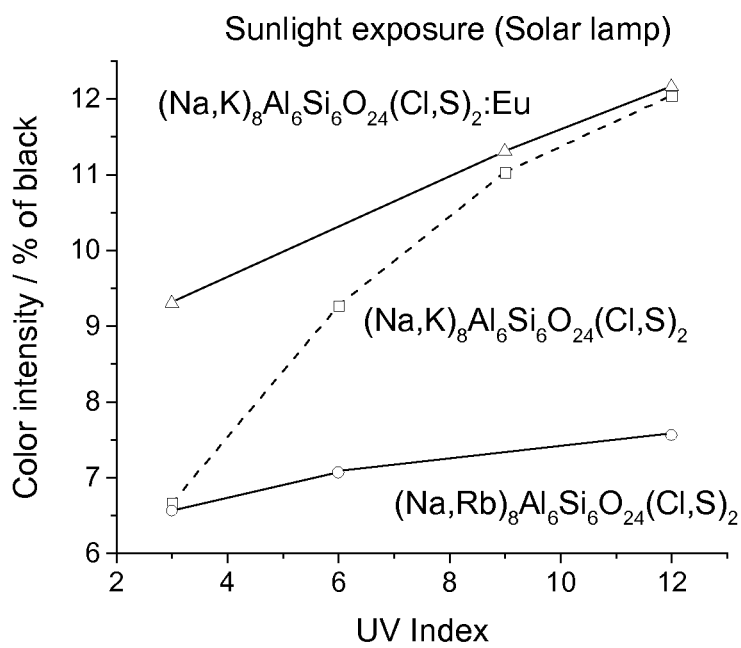
FIG. 2 discloses the test results of example 6.

The result is presented in FIG. 2 showing that the color intensity of the prepared material is a function of sunlight intensity and UV index.

Example 7—Testing of a Sample of the Materials Prepared in Example 1 and Example 2

Figure 3A:
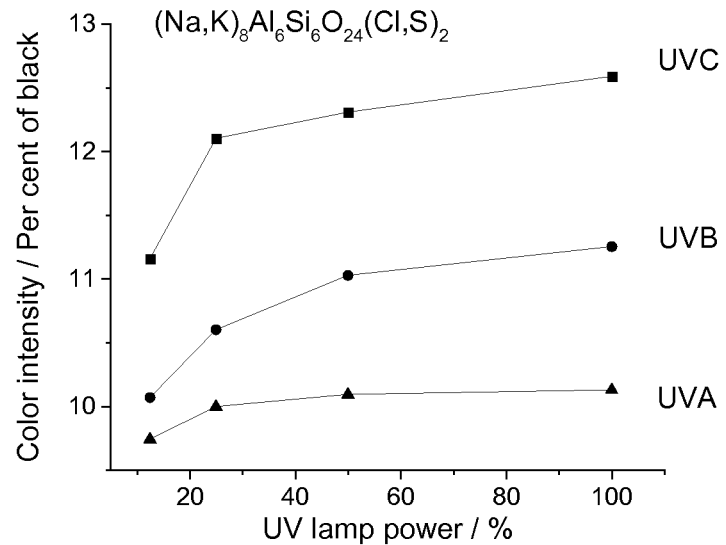
FIG. 3a and FIG. 3b disclose the test results of example 7.
Figure 3B:
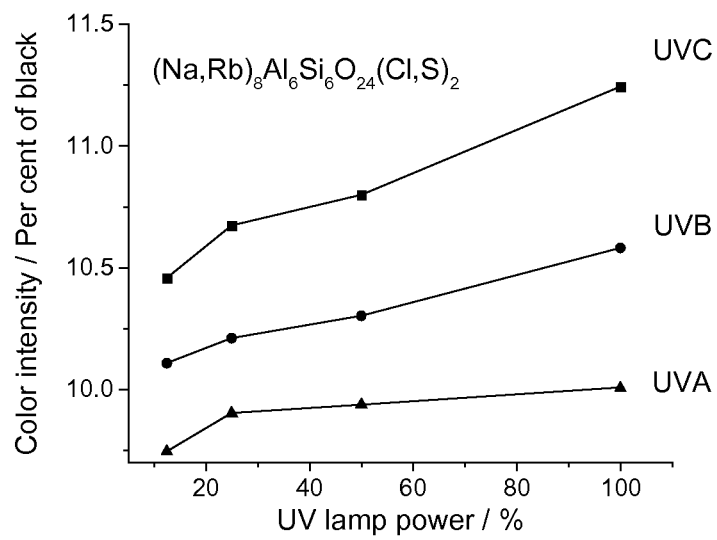

A sample of each of the material as prepared in example 1 and example 2 were tested by irradiating with UVA (330-350 nm), UVB (295-315 nm) and UVC (260-280 nm) using a Varian Cary Eclipse luminescence spectrometer. After each irradiation, the sample holder was photographed and the irradiated and non-irradiated parts were analyzed with the ImageJ program to obtain the intensity of color. This intensity value is divided with that obtained for carbon black to obtain a value describing the color intensity in comparison with a completely black material. The sample was then replaced and re-irradiated with the next power. The results are presented in FIG. 3a and FIG. 3b showing that the color intensity of the prepared material is a function of UV lamp intensity for UVA, UVB and UVC. The color intensity for $(Na,Rb)_8Al_6Si_6O_{24}(Cl,S)_2$ was obtained as follows:

$$\text{Color intensity [\% of black]} = -0.4 * \exp^{(UVA\ lamp\ power\ [\%]/-25.6)} + 10.0$$

$$\text{Color intensity [\% of black]} = -2.6 * \exp^{(UVB\ lamp\ power\ [\%]/-446)} + 12.7$$

$$\text{Color intensity [\% of black]} = -2.0 * \exp^{(UVC\ lamp\ power\ [\%]/-177)} + 12.4$$

Example 8—Testing of a Sample of the Material Prepared in Example 1

Figure 4:
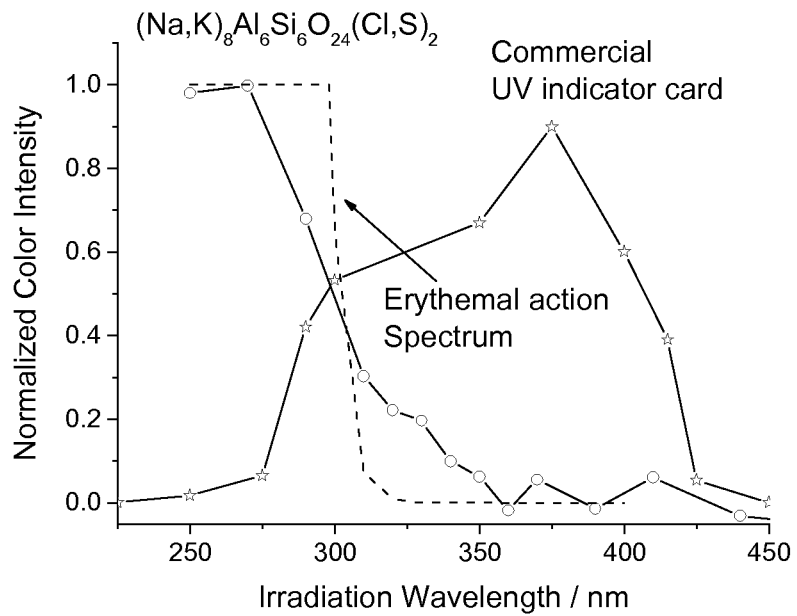
FIG. 4 discloses the test results of example 8.

A sample of the material as prepared in example 1 was tested and compared with commercial ultraviolet (UV) indicator card (Good Life Innovations Ltd/Colour Changing, UK). The test procedure was the same as described in example 5 above. Further, the erythemal action spectrum was tested for both following the procedure described in Webb, A. R., Slaper, H., Koepke, P., and Schmalwieser, A. W., Know your standard: Clarifying the erythema action spectrum, Photochemistry and Photobiology 87 (2011) 483-486. The results are presented in FIG. 4 showing a comparison of the absorption edges for coloring of $(Na,K)_8Al_6Si_6O_{24}(Cl,S)_2$ and the commercial UV indicator card as well as the erythemal action spectrum of human skin (dashed line).

Example 9—Testing of a Sample of the Material Prepared in Example 2

Figure 5:
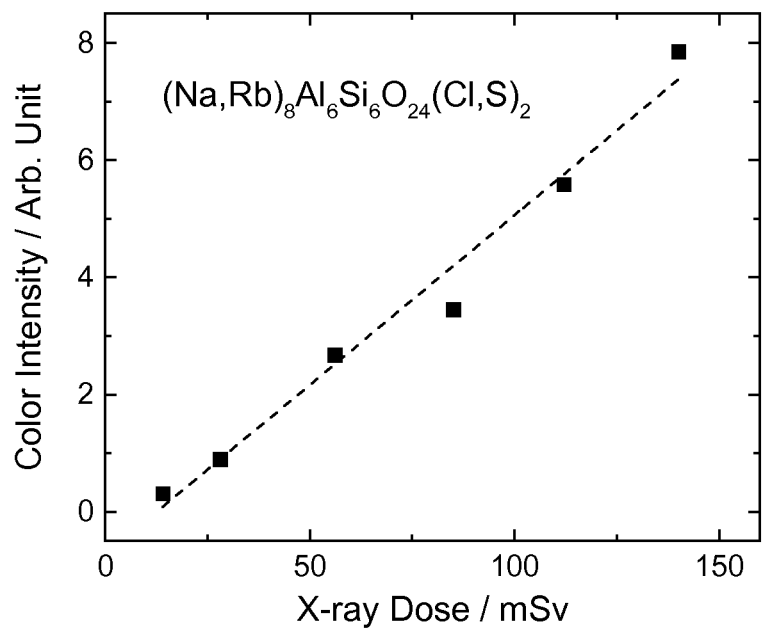
FIG. 5 discloses the test results of example 9.

A sample of the material as prepared in example 2 was tested by exposing to CuK$_\alpha$ X-rays (wavelength=0.15 nm, energy=8.05 keV). The results are presented in FIG. 5 showing the effect of the X-ray dose on the color intensity of the material. From the results one can see that the color intensity of the material increased linearly with increasing the X-ray dose. Therefore, the color intensity can be used as a sensor for X-ray dose:

$$D=aC+b$$

where
D=X-ray dose;
a=calibration constant 1;
C=color intensity; and
b=calibration constant 2.

It is obvious to a person skilled in the art that with the advancement of technology, the basic idea of the invention may be implemented in various ways. The invention and its embodiments are thus not limited to the examples described above; instead they may vary within the scope of the claims.

The invention claimed is:

1. A material represented by the following formula (I)

$$(M')_8 M''_6 M'''_6 O_{24}(X,S)_2:M'''' \qquad \text{formula (I)}$$

wherein
M' represents a combination of at least two monoatomic cations of different alkali metals selected from a group consisting of Li, Na, K, and Rb;
M'' represents a trivalent monoatomic cation of a metal selected from a group consisting of Al and Ga, or a trivalent monoatomic cation of B, or a trivalent monoatomic cation of a transition element selected from any of Groups 3-12 of the IUPAC periodic table of the elements, or any combination of such cations;
M''' represents a monoatomic cation of an element selected from a group consisting of Si and Ge, or any combination of such cations;
X represents an anion of an element selected from a group consisting of O, S, Se, and Te, or any combination of such anions, or X represents an anion of an element selected from a group consisting of F, Cl, Br, and I, or any combination of such anions; and
M'''' represents a dopant cation of an element selected from rare earth metals of the IUPAC periodic table of the elements, or transition metals of the IUPAC periodic table of the elements, or any combination of such cations, or wherein M'''' is absent.

2. The material of claim 1, wherein M' represents a combination of at least two monoatomic cations of different alkali metals selected from a group consisting of Li, Na, K, and Rb, wherein the combination comprises 0-98 mol-%, or 0-95 mol-%, or 0-90 mol-%, or 0-85 mol-%, or 0-80 mol-%, or 0-70 mol-%, of the monoatomic cation of Na.

3. The material of claim 1, wherein M' represents a combination of at least two monoatomic cations of different alkali metals selected from a group consisting of Li, Na, K, and Rb, and wherein the combination comprises at most 66 mol-% of the monoatomic cation of Na.

4. The material of claim 1, wherein M' represents a combination of a monoatomic cation of Na with a monoatomic cation of Li, a monoatomic cation of K and/or a monoatomic cation of Rb.

5. The material of claim 1, wherein M'''' represents a cation of an element selected from a group consisting of Eu and Tb, or a combination of such cations.

6. The material of claim 1, wherein M'''' represents a cation of an element selected from a group consisting of Ti, V, Cr, Mn, Fe, Co, Ni, Cu, and Zn, or any combination of such cations.

7. The material of claim 1, wherein M' represents a combination of at least two monoatomic cations of different alkali metals selected from a group consisting of Na, K, and Rb, and wherein the combination is selected in order to provide a predetermined absorption edge for the material.

8. The material of claim 1, wherein the material is configured to change color on exposure to ultraviolet radiation, wherein the correlation between the intensity of the color of the material and the intensity of the ultraviolet radiation is calculated based on the following formula 1:

$$y=A1*e^{(x/t1)}+y0 \qquad \text{formula 1}$$

wherein the parameters have the following meanings:
y=color intensity [percent of black]
A1=amplitude for color
x=UV index value for sunlight or UV lamp power [%] for UVA, UVB, and/or UVC
t1=growth constant for color
y0=initial offset for color.

9. The material of claim 1, wherein the material is selected from a group consisting of $(Na,K)_8Al_6Si_6O_{24}(Cl,S)_2$, $(Na,Rb)_8Al_6Si_6O_{24}(Cl,S)_2$, $(Na,K,Rb)_8Al_6Si_6O_{24}(Cl,S)_2$, $(Na,K)_8Al_6Si_6O_{24}(Cl,S)_2$:Eu, $(Na,K)_8Al_6Si_6O_{24}(Cl,S)_2$:Tb, $(Li,K)_8Al_6Si_6O_{24}(Cl,S)_2$, $(Li,Rb)_8Al_6Si_6O_{24}(Cl,S)_2$, $(Li,K,Rb)_8Al_6Si_6O_{24}(Cl,S)_2$, and $(Li,Na,K,Rb)_8Al_6Si_6O_{24}(Cl,S)_2$.

10. An ultraviolet radiation sensing material, characterized in that the material is a material as defined in claim 1.

11. An X-radiation sensing material, characterized in that the material is a material as defined in claim 1.

12. A device, characterized in that the device comprises a material as defined in claim 1.

13. The device of claim 12, wherein the device is an ultraviolet radiation sensor, an ultraviolet radiation detector, or an ultraviolet radiation indicator.

14. The device of claim 12, wherein the device comprises a device for indicating the presence of ultraviolet radiation.

15. The device of claim 14, wherein the ultraviolet radiation is ultraviolet A radiation, ultraviolet B radiation and/or ultraviolet C radiation.

16. The device of claim 12, wherein the device comprises a device for indicating the presence of X-radiation.

17. The device of claim 12, wherein the device comprises a security device.

18. A method for determining the intensity of ultraviolet radiation and/or X-radiation, wherein the method comprises:
a) providing a material as defined in claim 1;
b) subjecting the material provided in step a) to ultraviolet radiation and/or X-radiation;
c) determining a change in the color of the material caused by the ultraviolet radiation and/or the X-radiation; and
d) comparing the color of the material with a reference indicating the correlation of the intensity of the ultraviolet radiation and/or X-radiation with the color of the material.

19. The method of claim 18, wherein step c) comprises visually determining the change in the color of the material.

* * * * *